United States Patent
Chiu (10) Patent No.: US 8,260,227 B2
(45) Date of Patent: Sep. 4, 2012

(54) DIRECT CONVERSION RECEIVER AND DC OFFSET CONCELLATION METHOD

(75) Inventor: Chinq-Shiun Chiu, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 893 days.

(21) Appl. No.: 12/136,169

(22) Filed: Jun. 10, 2008

(65) Prior Publication Data

US 2009/0305656 A1 Dec. 10, 2009

(51) Int. Cl.
*H04B 1/00* (2006.01)
*H04B 15/00* (2006.01)
*H04B 1/10* (2006.01)

(52) U.S. Cl. ....... 455/130; 455/63.1; 455/283; 455/296; 455/310; 455/317

(58) Field of Classification Search .................. 455/63.1, 455/283–285, 296, 298–299, 302, 305, 310, 455/313, 317, 323, 326, 333
See application file for complete search history.

(56) References Cited

U.S. PATENT DOCUMENTS

| | | | |
|---|---|---|---|
| 6,115,593 A | 9/2000 | Alinikula et al. | |
| 6,785,530 B2 | 8/2004 | Hatcher et al. | |
| 7,254,379 B2* | 8/2007 | Xu et al. | 455/296 |
| 7,421,260 B2* | 9/2008 | Darabi | 455/130 |
| 7,542,751 B2* | 6/2009 | Chiu et al. | 455/313 |
| 7,715,836 B2* | 5/2010 | Vassiliou et al. | 455/423 |
| 7,778,613 B2* | 8/2010 | Seendripu et al. | 455/130 |
| 7,783,273 B2* | 8/2010 | Maeda et al. | 455/285 |
| 7,899,431 B2* | 3/2011 | Rahman et al. | 455/324 |
| 7,929,938 B2* | 4/2011 | Sellars et al. | 455/333 |
| 2002/0160740 A1* | 10/2002 | Hatcher et al. | 455/317 |
| 2004/0038649 A1* | 2/2004 | Lin et al. | 455/130 |
| 2004/0152436 A1* | 8/2004 | Masenten et al. | 455/323 |
| 2004/0242178 A1 | 12/2004 | Kim et al. | |
| 2005/0170806 A1 | 8/2005 | Kim | |
| 2006/0068746 A1* | 3/2006 | Feng et al. | 455/323 |
| 2006/0073803 A1* | 4/2006 | Igarashi et al. | 455/296 |
| 2006/0227910 A1* | 10/2006 | Ramasubramanian et al. | 375/346 |
| 2007/0080835 A1 | 4/2007 | Maeda et al. | |

(Continued)

FOREIGN PATENT DOCUMENTS

CN 1728694 2/2006

(Continued)

OTHER PUBLICATIONS

Kivekaes, Kalle, et al., "Characterization of IIP2 and CD-Offsets in Transconductance Mixers", IEEE Transactions of Circuits and Systems-II: Analog and Digital Signal Processing, vol. 48, No. 11, Nov. 2001.

English language translation of abstract of TW 283277 (published Aug. 11, 1996).

(Continued)

Primary Examiner — Simon Nguyen
(74) Attorney, Agent, or Firm — Thomas|Kayden (57) ABSTRACT

A direct conversion receiver and a DC offset cancellation method are provided. An RF module receives a transmission signal to generate an RF signal. A mixer converts the RF signal to a mixer output comprising baseband and imaginary parts. A filter module filters out the imaginary part of the mixer output and adjusts gain of the baseband part to generate a baseband signal. A calibrator performs a calibration to determine a mismatch value of the mixer. A static DC offset canceller provides a constant offset compensation according to the mismatch value; wherein the mismatch value is used to minimize component mismatching effects of the mixer.

13 Claims, 6 Drawing Sheets

U.S. PATENT DOCUMENTS

2007/0099570 A1* 5/2007 Gao et al. .................. 455/63.1
2007/0237264 A1* 10/2007 Huang et al. ............... 375/332
2008/0014895 A1* 1/2008 Li et al. ...................... 455/324
2008/0113625 A1* 5/2008 Maeda et al. ............ 455/67.14

FOREIGN PATENT DOCUMENTS

| | | |
|---|---|---|
| TW | 283277 | 8/1996 |
| TW | I287914 | 10/2007 |

OTHER PUBLICATIONS

English language translation of abstract of TW I287914 (published Oct. 1, 2007).
Furuta, Y., et al.; "A Low Flicker-Noise Direct Conversion Mixer in 0.12 um CMOS with Dual-Mode DC Offset Cancellation Circuits;" IEEE; 2007; pp. 265-268.
English language translation of abstract CN 1728694 (published Feb. 1, 2006).

\* cited by examiner

DIRECT CONVERSION RECEIVER AND DC OFFSET CONCELLATION METHOD

BACKGROUND OF THE INVENTION

1. Field of the Invention

The invention relates to a direct conversion receiver, and in particular, to DC offset cancellation in a direct conversion receiver.

2. Description of the Related Art

Figure 1A:
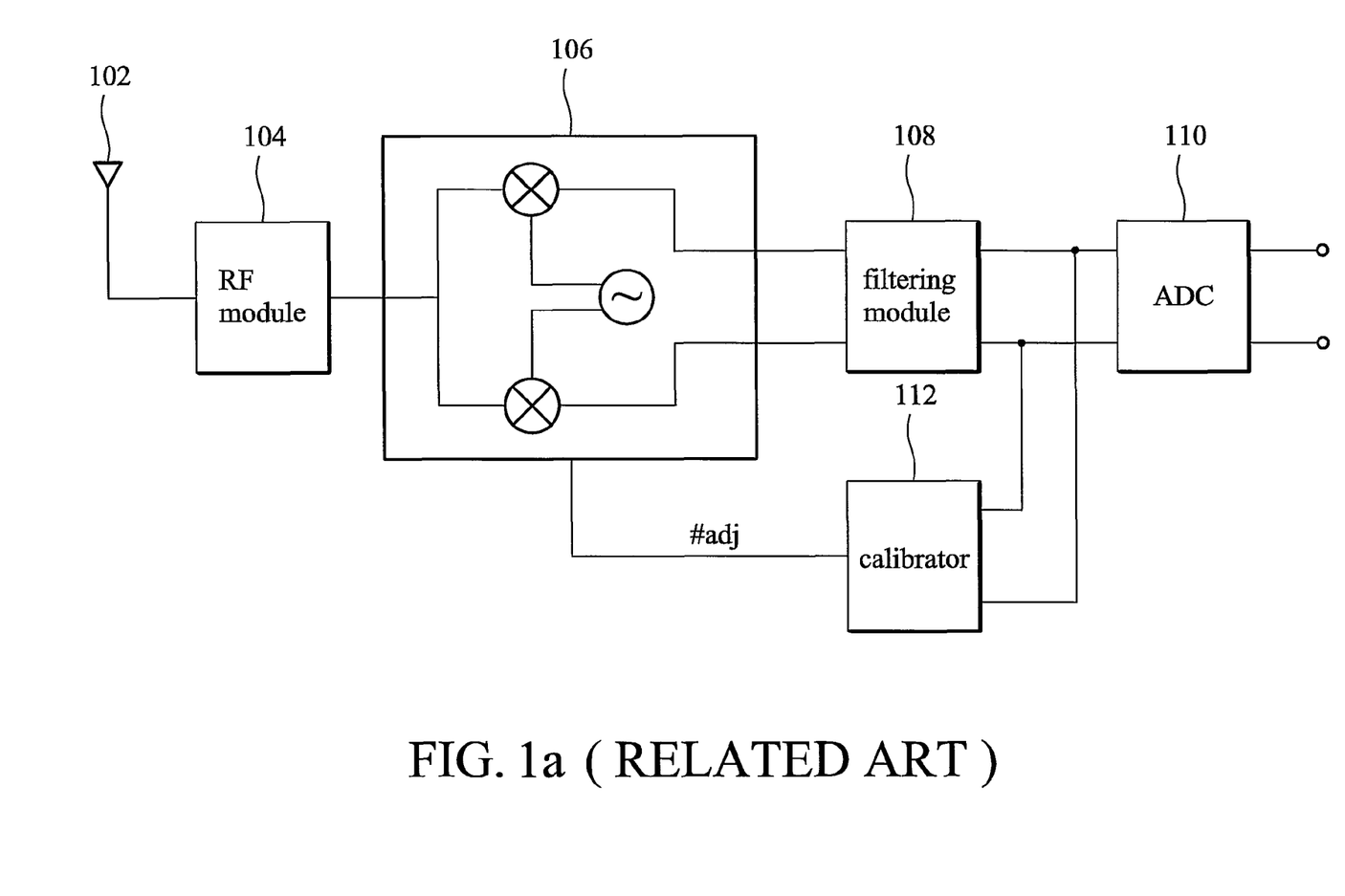
FIG. 1a shows a conventional direct conversion receiver with mismatch calibration.

FIG. 1a shows a conventional direct conversion receiver with mismatch calibration. An RF signal is received through an antenna 102, and the RF module 104 performs a preliminary adjustment such as low noise amplification (LNA) and bandpass filtering. The mixer 106 then down converts the RF signal to a baseband signal, and the filtering module 108 performs a post adjustment such as low pass filtering (LPF) and programmable gain amplification (PGA) to generate a quality baseband signal before sending to the analog to digital converter (ADC) 110. DC offset is a common issue induced in direct conversion receivers, degrading down conversion performance. In some cases, a calibrator 112 is provided to calibrate component imbalances in the mixer 106. The calibrator 112 may be coupled to the mixer 106, adjusting component mismatches such as resistor imbalance according to DC offset measured from the output of mixer 106 or the filtering module 108.

Figure 1B:
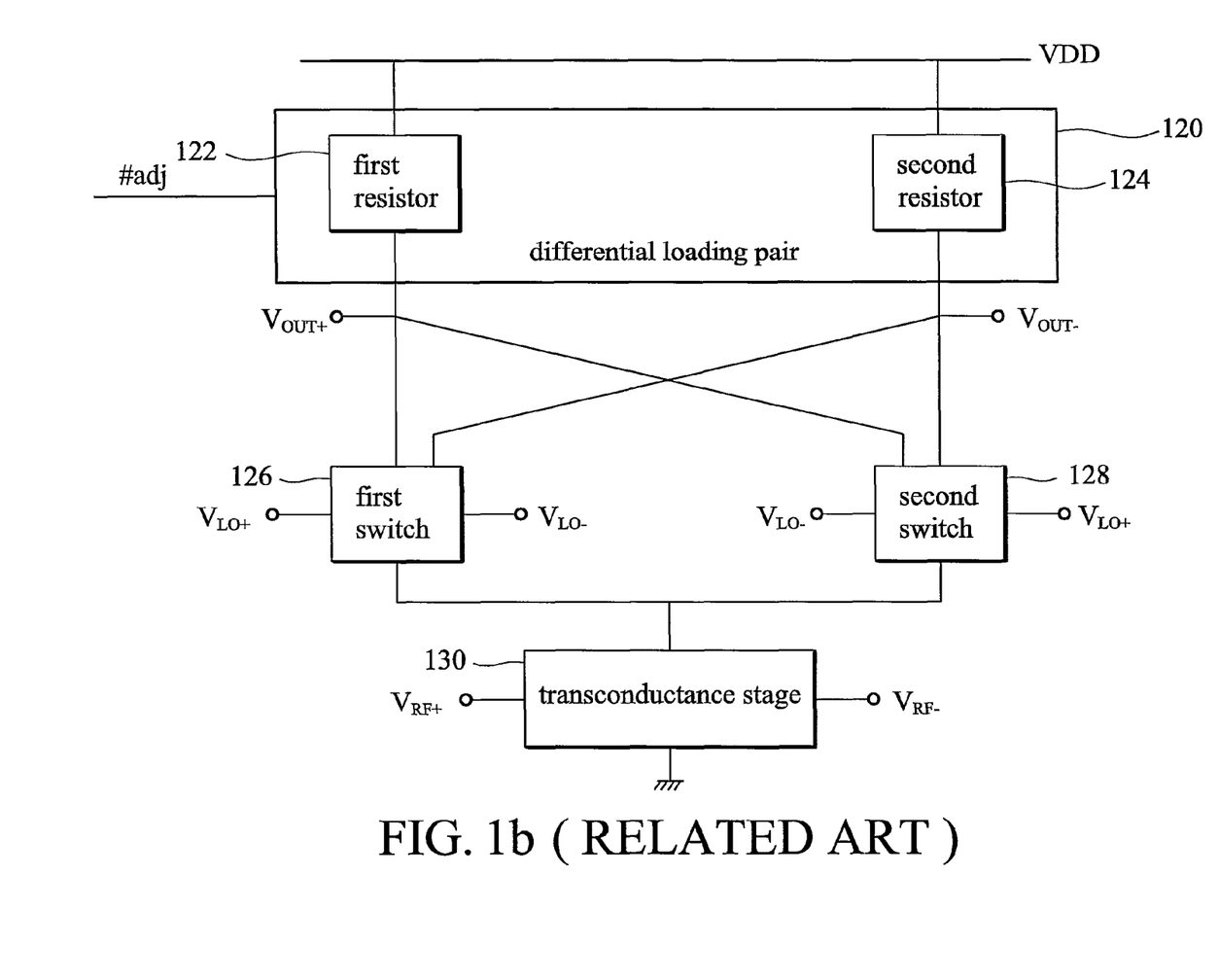
FIG. 1b shows a conventional mixer with an adjustable differential loading pair.

FIG. 1b shows a conventional mixer with an adjustable differential loading pair 120. As known, DC offset of a mixer 106 is induced from component imbalances possibly occurring in the first switch 126, second switch 128, and the transconductance stage 130. The differential loading pair 120 comprises a first resistor 122 and second resistor 124, with at least one an adjustable resistor. The mismatch of differential loading pair 120 can be adjusted to minimize the induced DC offset, inducing an optimal mixer output. Thus, the calibrator 112 operates in a calibration mode to adjust the first resistor 122 or second resistor 124 through an adjustment value #adj. When a specific resistor imbalance is found to correspond to the optimal mixer output, the calibrator 112 configures the differential loading pair 120 with that specific resistor imbalance value, and the direct conversion receiver switches to a normal mode, operating with the adjusted mixer 106. When the direct conversion receiver operates in the normal mode, the calibrator 112 is turned off or removed. Typically, the calibrator 112 is only provided in the manufacturing stage to characterize every mixer 106 in the product line, and each mixer 106 may be configured with different adjustment value #adj in the calibration due to component differences. With a calibrated mixer 106, a down conversion receiver can operate with optimum performance.

Figure 2A:
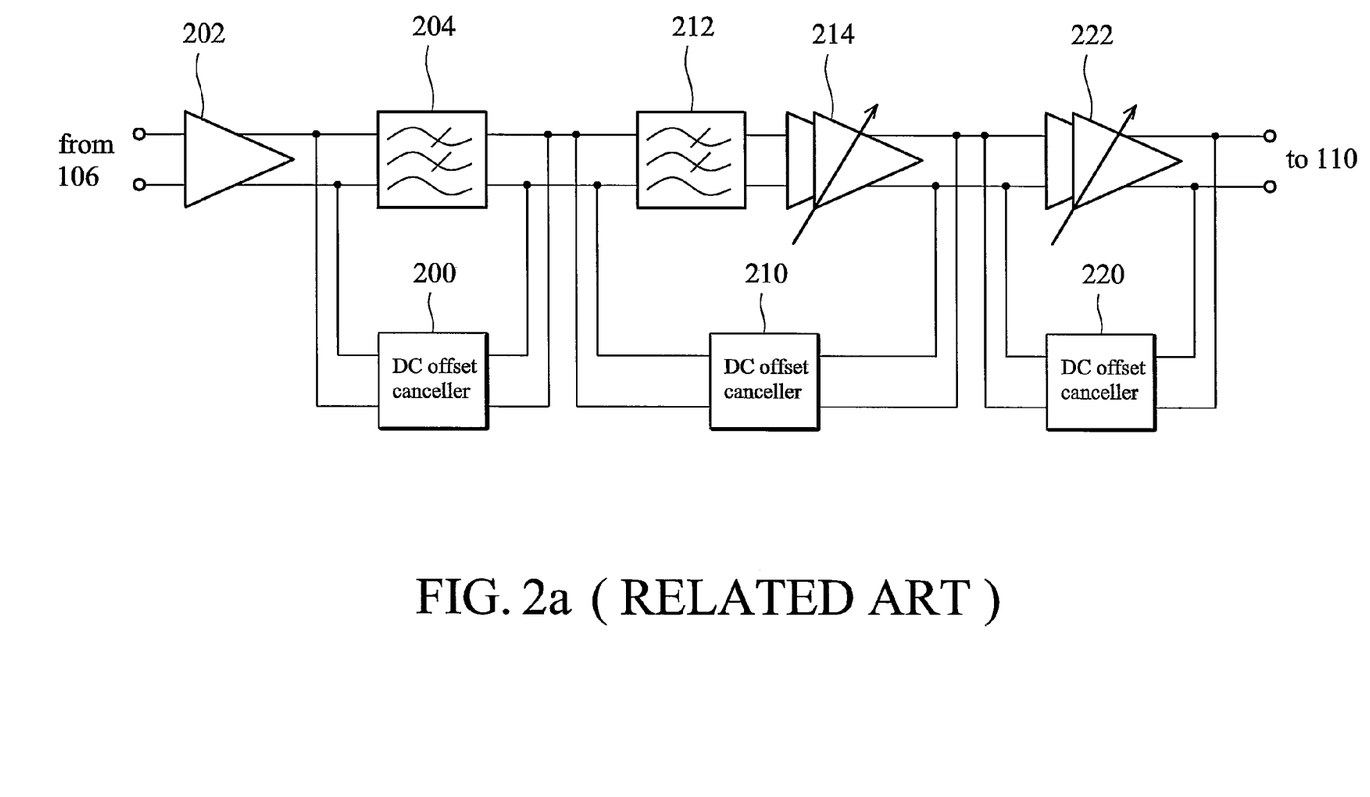
FIGS. 2a and 2b show various implementations of the filtering stages.
Figure 2B:
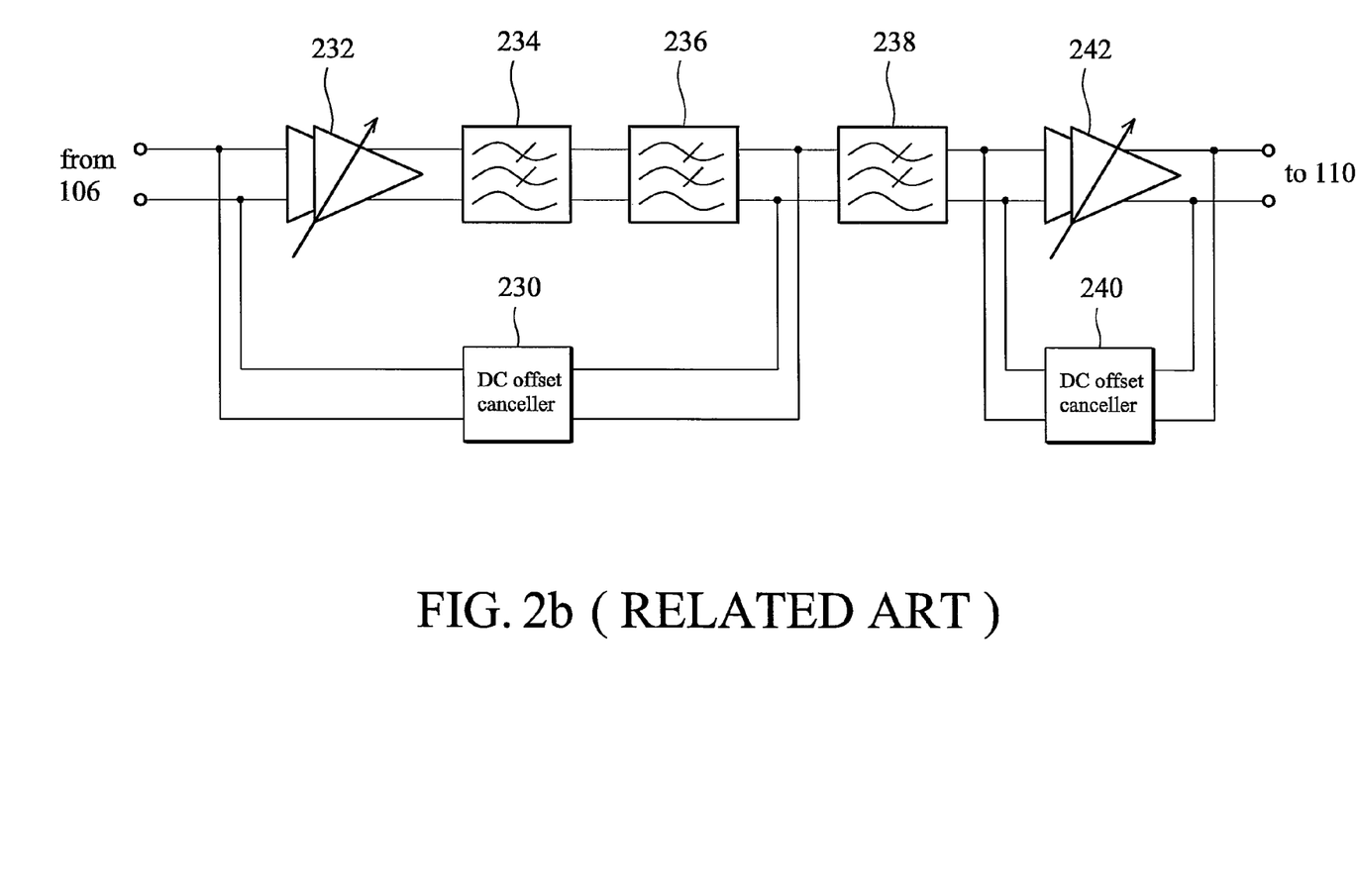

FIGS. 2a and 2b show various implementations of the filtering module 108. In FIG. 2a, three DC offset cancellation (DCOC) loops are shown. The filter 204 and the first DC offset canceller 200 form a first DCOC loop, the filter 212, amplifier 214 and second DC offset canceller 210 form a second DCOC loop, and the amplifier 222 and third DC offset canceller 220 form a third DCOC loop. Conventionally, the DC offsets are cancelled stage by stage, each consuming a predetermined convergence time. There are various implementations of the DC offset cancellers 200, 210 and 220. The DC offset cancellers 200, 210 and 220 may be implemented in analog or digital form, and the convergence speed may be fast or slow. FIG. 2b shows another known implementation of filtering module 108. The DC offset canceller 230 forms a DCOC loop with amplifier 232, filter 234 and filter 236 while the DC offset canceller 240 detects and cancels DC offset of the amplifier 242. Typically, the DC offset cancellers 200 to 240 perform DC offset cancellation by measuring DC offsets from output ends of their loops, and generating compensations to the input of their input ends.

IEEE paper "Characterization of IIP2 and DC-Offsets in Transconductance Mixers", disclose how IIP2 can be calculated as functions of load resistor imbalance and duty cycle mismatch, and the resistor imbalance is tuned to optimize the IIP2 of a mixer. The mixer output tuned by the resistor imbalance may comprise a DC offset comprising static and dynamic parts:

$$V_{DC} = V_{DC\_static} + V_{DC\_dynamic} = R_L I_T \frac{\Delta R}{2} + \tag{1}$$
$$\frac{1}{2} R_L \eta_{nom} g m \alpha'_2 A_{RF}^2 [\Delta \eta(\Delta gm + \Delta A_{RF}) + \Delta R(1 + \Delta gm \Delta A_{RF})]$$

Where $\Delta A_{RF}$ is amplitude difference of the RF signals $V_{RF+}$ and $V_{RF-}$; $g_m$ is conductivity of the components in first switch 126 and second switch 128, and $\Delta g_m$ is their mismatch; $\Delta \eta$ is duty cycle mismatch of the local oscillation signals $V_{LO+}$ and $V_{LO-}$, $\Delta R$ is the resistor imbalance of the first resistor 122 and second resistor 124. By calibrating the mixer 106 with calibrator 112, the dynamic part can be eliminated by assigning the resistor imbalance $\Delta R$ to a specific value, however, the static part still remains and is sent to the filtering module 108.

$$V_{DC\_dynamic} = \tag{2}$$
$$\frac{1}{2} R_L \eta_{nom} g m \alpha'_2 A_{RF}^2 [\Delta \eta(\Delta gm + \Delta A_{RF}) + \Delta R(1 + \Delta gm \Delta A_{RF})]$$

$$V_{DC\_static} = R_L I_T \frac{\Delta R}{2} \tag{3}$$

BRIEF SUMMARY OF INVENTION

An exemplary embodiment of a direct conversion receiver is provided. An RF module receives a transmission signal to generate an RF signal. A mixer converts the RF signal to a mixer output comprising baseband and imaginary parts. A filter module filters out the imaginary part of the mixer output and adjusts gain of the baseband part to generate a baseband signal. A calibrator performs a calibration to determine a mismatch value of the mixer. A static DC offset canceller provides a constant offset compensation according to the mismatch value; and the mismatch value is used to minimize component mismatching effects of the mixer.

When the calibrator performs the calibration, the static DC offset canceller is turned off. When the calibrator finishes the calibration and obtains the mismatch value, the calibrator is turned off and the static DC offset canceller is turned on.

The calibrator performs the calibration by recursively adjusting a component mismatch of the mixer, and measuring a DC offset of the baseband signal induced by the component mismatch. The value of component mismatch is stored as the mismatch value when a minimum DC offset is induced thereby. The mixer comprises a differential loading pair adjustable by the calibrator, and the component mismatch is a resistor mismatch of the differential load pair. The mismatch value is the optimum resistor mismatch that minimizes component mismatching effects of the mixer.

When the mismatch value is applied to the mixer, a static DC offset is induced on the mixer output. The static DC offset canceller directly provides a compensation to eliminate the static DC offset based on the mismatch value.

The invention also provides a DC offset cancellation method implemented by the described direct conversion receiver. A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
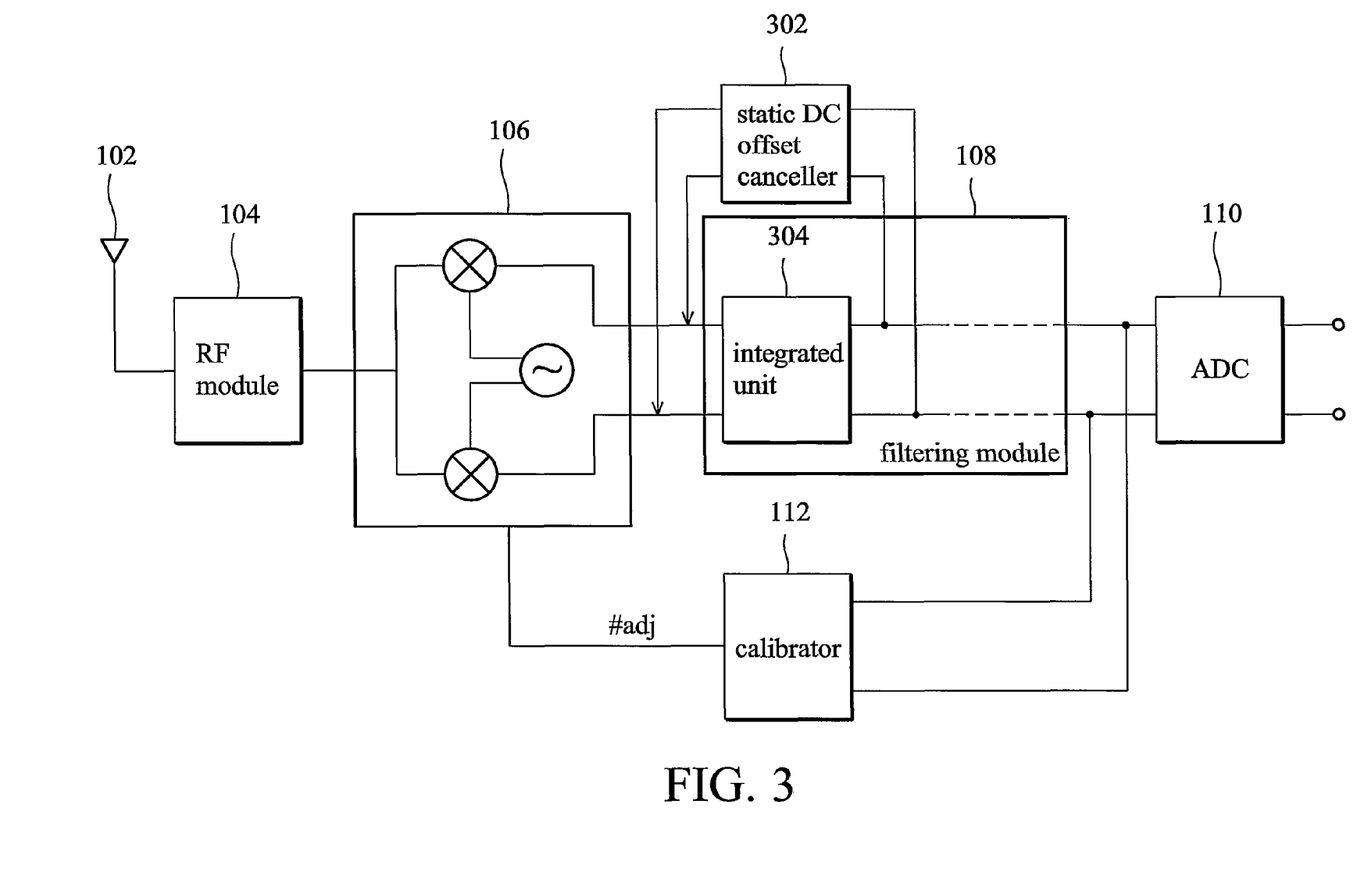
FIG. 3 shows an embodiment of a direct conversion receiver.

FIG. 3 shows an embodiment of a direct conversion receiver. Like in FIG. 1a, an RF signal is received through an antenna 102, and the RF module 104 performs a preliminary adjustment such as low noise amplification (LNA) and band-pass filtering. The mixer 106 then down converts the RF signal to a baseband signal, and the filtering module 108 performs a post adjustment such as low pass filtering (LPF) and programmable gain amplification (PGA) to generate a quality baseband signal before sending to the analog to digital converter 110.

In the embodiment, a static DC offset canceller 302 is provided, coupled to the output of mixer 106. The static DC offset canceller 302 is designed to compensate the static part of the DC offset induced by the resistor imbalance $\Delta R$ of the first resistor 122 and second resistor 124 as shown in equation (3). In this way, the DCOC loops in the filtering module 108 shown in FIGS. 2a and 2b are not burdened by the effects of resistor imbalance $\Delta R$, thus performance is improved. As described, the mixer 106 is calibrated by the calibrator 112 with an adjustment value #adj. The differential loading pair 120 in FIG. 1b may comprise a binary weighted resistor providing equivalent resistance in response to the adjustment value #adj. The adjustment value #adj may be stored in the mixer 106 after calibration, and when the direct conversion receiver operates in normal mode, the mixer 106 and static DC offset canceller 302 can read the adjustment value #adj to perform corresponding compensations.

The calibration may be performed only one time when manufacturing the mixer 106. When the calibrator 112 performs the calibration, the static DC offset canceller 302 is turned off, and other DC offset cancellers in the filtering module 108 as shown in FIGS. 2a and 2b, may also be disabled while calibrating.

A calibration process can be performed as follows. A DC offset (VDC_0) is detected when no RF signal is received by the RF module 104. VDC_0 can be calculated by formula (3) ($V_{DC\_static}$). Take GSM for example, if a wanted signal is 900 MHz, blocker signals (894 MHz and 906 MHz) are used in a calibration mode to test what an induced DC offset will be at the output of the filtering module 108. That is, a test is performed to see how a blocker signal can affect the DC offset at the output of the filtering module 108.

Then, a blocker signal (906 MHz) is sent and received by the RF module 104. A DC offset (VDC_1) is detected again. VDC_1 can be calculated by formula (1) ($V_{DC}$). That is, VDC_1 includes $V_{DC\_static}$ and $V_{DC\_dynamic}$. By subtracting VDC_0 from VDC_1, $V_{DC\_dynamic}$ can be obtained.

Many trial adjustment value #adj can be used to adjust $\Delta R$. For each trial adjustment value #adj, $V_{DC\_dynamic}$ can be obtained by the above-mentioned method. Among the measured results corresponding to the trial adjustment value #adj, an optimum $V_{DC\_dynamic}$ may be found (that is, $V_{DC\_dynamic}=0$), and the corresponding adjustment value #adj is taken as the calibration result.

When the calibrator 112 finishes the calibration and obtains the optimum adjustment value #adj, the calibrator 112 is turned off since it is no longer necessary, and the DCOC loops in the filtering module 108 as well as the static DC offset canceller 302, are turned on for normal operation.

As shown in FIG. 1b, the mixer 106 comprises a differential loading pair 120 adjustable by the calibrator. The embodiment adjusts a resistor mismatch of the differential loading pair 120 by the adjustment value #adj. Thus, the optimum adjustment value #adj renders an optimum resistor mismatch that minimizes other component mismatching effects of the mixer. Specifically, the dynamic part of the DC offset as described in formula (2) can be eliminated through this calibration, and only the static part of the DC offset as shown in formula (3) is output.

As the mixer 106 operates in normal mode with the optimum adjustment value #adj applied, a static part of DC offset as formula (3) is induced on the mixer 106 output. The DC offset as formula (3) can be increased or decreased because $\Delta R$ has been changed by the adjustment value #adj. The static DC offset canceller 302 is enabled in normal mode, directly providing a compensation to eliminate the static part of DC offset based on the resistor imbalance $\Delta R$ of the differential loading pair 120. Specifically, the static DC offset canceller 302 generates a complementary DC offset having same magnitude of formula (3) to cancel the static part of DC offset. With the calibrated mixer 106 and the static DC offset canceller 302, the input of filtering module 108 can be optimized to a zero DC offset signal.

In the embodiment, the static DC offset canceller 302 may be a single block unit, or implemented by combination with conventional DCOC loops. For example, the filtering module 108 may comprise an integrated unit 304 connected to the output of mixer. The integrated unit 304 may be a low pass filter (LPF) or a programmable gain amplifier (PGA), inducing additional component dependent DC offsets. The static DC offset canceller 302 may form a DCOC loop with the integrated unit 304, simultaneously eliminating the additional component dependent DC offsets induced by the integrated unit 304 and the static DC offset induced by the mixer 106. Furthermore, the DC offset canceller 230 in FIG. 2b may be modified to include the function of the static DC offset canceller 302. In an alternative case, the constant offset compensation may not be limited to be identical to the static part of DC offset as formula (3). Since the scale of adjustable resistor in the differential loading pair 120 is a known parameter, the possible range of resistor imbalance ΔR is also a bounded value. If the DC offset canceller 230 is modified to include the constant offset compensation, the constant offset may be selected to be an average of the possible range of resistor imbalance ΔR. Over a period of convergence time, the modified DC offset canceller 230 will converge to automatically balance the DC offset in its DCOC loop. If the DC offset canceller 230 is originally a slow convergence unit, including the constant offset compensation can increase its convergence performance.

In general, the embodiment allows any variation of the DCOC loop to eliminate the static DC offset at the input end of filtering module 108 before it is amplified in the stages thereafter. Furthermore, the DC offset canceller 302 or the variations can be digital signal processing circuits in the embodiment.

Figure 4:
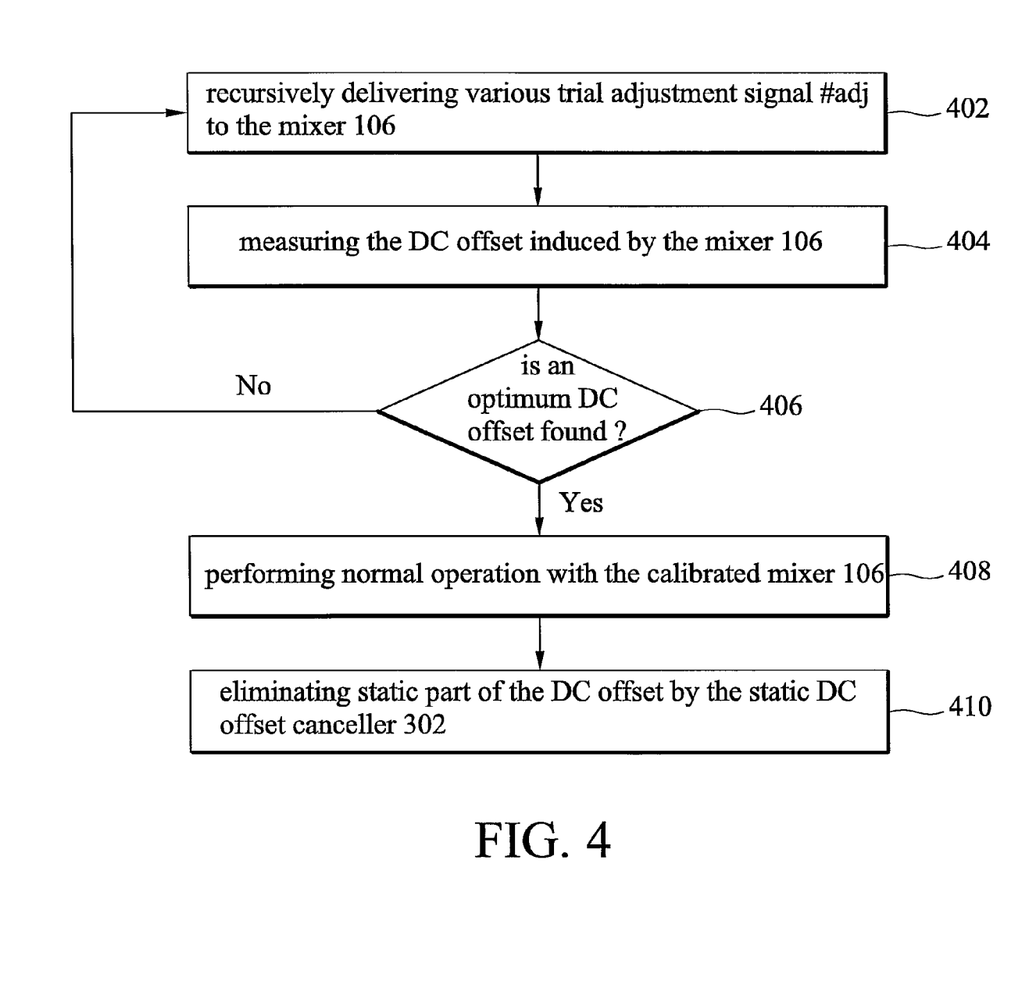
FIG. 4 is a flowchart of a DC offset cancellation method according to an embodiment of the invention.

FIG. 4 is a flowchart of a DC offset cancellation method according to an embodiment of the invention. Steps 402, 404 and 406 are calibration mode, and steps 408 and 410 are normal mode. In step 402, the calibrator 112 recursively delivers various trial adjustment values #adj to the mixer 106. In step 404, the DC offset induced by the mixer 106 is measured by the calibrator 112. In step 406, the calibrator 112 determines whether an optimum DC offset is found (that is, $V_{DC\_dynamic}=0$). If not, the calibration loops to step 402. If an optimum DC offset corresponding to an adjustment value #adj is found, the mixer 106 records the adjustment value #adj as a calibration mode, and the calibrator 112 is turned off or removed. When the direct conversion receiver operates in normal mode, a wanted RF signal is converted to a mixer output by the mixer 106. In step 408, since the mixer 106 is calibrated, dynamic part of the DC offset as shown in formula (2) is eliminated. However, a static part as formula (3) is induced due to the resistor imbalance generated by the calibration. In step 410, the static DC offset canceller 302 is enabled to eliminate static part of the DC offset.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A direct conversion receiver, comprising:
a mixer for down-converting an RF signal into a base band signal, wherein the base band signal comprises a dynamic DC offset and a static DC offset induced by the mixer;
a filtering module for filtering the base band signal and outputting a filtered signal;
a calibrator, coupled to the mixer, suppressing the dynamic DC offset of the filtered signal, wherein the calibrator performs a calibration to measure a mismatch value of the filtered signal, wherein the calibrator utilizes at least two blocker signals for each wanted calibration signal during calibration for determining whether a DC offset will be induced at the output of the filtering module; and
a static DC offset canceller, coupled to the output of the mixer, suppressing the static DC offset of the filtered signal, wherein the static DC offset canceller provides a constant offset compensation according to the mismatch value.

2. The direct conversion receiver as claimed in claim 1, wherein:
when the calibrator performs the calibration, the static DC offset canceller is turned off;
when the calibrator finishes the calibration and obtains the mismatch value, the calibrator is turned off and the DCOC is turned on.

3. The direct conversion receiver as claimed in claim 1, wherein the calibrator performs the calibration by:
recursively adjusting a component mismatch of the mixer, and measuring a DC offset of the baseband signal induced by the component mismatch; and
storing the value of component mismatch as the mismatch value when a minimum DC offset is induced thereby.

4. The direct conversion receiver as claimed in claim 3, wherein:
the mixer comprises a differential loading pair adjustable by the calibrator;
the component mismatch is a resistor mismatch of the differential load pair; and
the mismatch value is the optimum resistor mismatch that minimizes component mismatching effects of the mixer.

5. The direct conversion receiver as claimed in claim 4, wherein:
when the mismatch value is applied to the mixer, a static DC offset is induced on the mixer output; and
the static DC offset canceller directly provides a compensation to eliminate the static DC offset based on the mismatch value.

6. The direct conversion receiver as claimed in claim 4, wherein:
the filter module comprises a low pass filter (LPF) connected to the output of mixer; and
the static DC offset canceller is also coupled to the output of the LPF, further compensating a LPF DC offset generated by the LPF.

7. The direct conversion receiver as claimed in claim 4, wherein:
the filter module comprises a programmable gain amplifier (PGA) connected to the output of mixer; and
the static DC offset canceller is also coupled to the output of the PGA, further compensating a PGA DC offset generated by the PGA.

8. A DC offset cancellation method for a direct conversion receiver comprising a mixer down-converting an RF signal into a base band signal and inducing a dynamic DC offset and a static DC offset; the method comprising:
in a calibration mode,
utilizing at least two blocker signals for each wanted calibration signal for determining whether a DC offset will be induced at the output of a filtering module in the direct conversion receiver; and
incrementally varying a component mismatch inside the mixer to find an optimum configuration where the dynamic DC offset is minimum; and
in a normal mode, suppressing the static DC offset when the component mismatch is fixed, wherein the suppression occurs by using the optimum configuration to further compensate the static DC offset.

9. The DC offset cancellation method as claimed in claim 8, wherein the calibration comprises:
recursively measuring various DC offsets of mixer outputs induced by the varying component mismatches; and
when a DC offset is minimum, storing the corresponding component mismatch as the optimum configuration.

10. The DC offset cancellation method as claimed in claim 9, wherein:
the mixer comprises a differential loading pair adjustable by the calibrator;
the component mismatch is a resistor mismatch of the differential load pair; and
the optimum configuration is the optimum resistor mismatch that minimizes the dynamic DC offset of the mixer.

11. The DC offset cancellation method as claimed in claim 10, further comprising in the normal mode:
applying the optimum resistor mismatch to the mixer, such that only the static DC offset is induced on the mixer output; and
calculating a static compensation value from the optimum resistor mismatch to eliminate the static DC offset.

12. A direct conversion receiver, comprising:
a mixer configured to down-convert an RF signal into a base band signal, wherein the base band signal comprises a dynamic DC offset and a static DC offset induced by the mixer;
a filtering module configured to filter the base band signal and output a filtered signal;
a calibrator, coupled to the mixer, configured to suppress the dynamic DC offset of the filtered signal, wherein the calibrator is further configured to utilize at least two blocker signals for each wanted calibration signal during a calibration mode for determining whether a DC offset will be induced at the output of the filtering module and for measuring a mismatch value of the filtered signal; and
a static DC offset canceller, coupled to the output of the mixer, configured to suppress the static DC offset of the filtered signal, wherein during the calibration mode, the static DC offset canceller is turned off.

13. The direct conversion receiver of claim 12, wherein the at least two blocker signals are each offset from the wanted calibration signal by a determined amount.

* * * * *